United States Patent
Ahmed et al.

(10) Patent No.: US 10,171,057 B1
(45) Date of Patent: Jan. 1, 2019

(54) AUTOMATIC GAIN CONTROL LOOP

(71) Applicant: Elenion Technologies, LLC, New York, NY (US)

(72) Inventors: Mostafa Ahmed, Urbana, IL (US); Alexander Rylyakov, Staten Island, NY (US)

(73) Assignee: Elenion Technologies, LLC, New York, NY (US)

( * ) Notice: Subject to any disclaimer, the term of this patent is extended or adjusted under 35 U.S.C. 154(b) by 0 days.

(21) Appl. No.: 15/927,537

(22) Filed: Mar. 21, 2018

(51) Int. Cl.
*H03F 3/16* (2006.01)
*H03F 3/68* (2006.01)
*H03G 3/30* (2006.01)
*H03G 1/00* (2006.01)
*H04B 10/69* (2013.01)

(52) U.S. Cl.
CPC ......... *H03G 3/3084* (2013.01); *H03G 1/0035* (2013.01); *H04B 10/6931* (2013.01); *H03F 3/16* (2013.01); *H03F 3/68* (2013.01); *H03F 2200/129* (2013.01); *H03G 2201/103* (2013.01)

(58) Field of Classification Search
CPC ............... H03G 3/3084; H03G 1/0035; H03G 2201/103; H04B 10/6931; H03F 3/68; H03F 3/16; H03F 2200/129
See application file for complete search history.

(56) References Cited

U.S. PATENT DOCUMENTS

| | | | |
|---|---|---|---|
| 2012/0155864 A1* | 6/2012 | Pepeljugoski | H04B 10/0799 398/37 |
| 2017/0126190 A1* | 5/2017 | Nakhkoob | H03G 3/3084 |
| 2017/0288618 A1* | 10/2017 | Asmanis | H03F 3/08 |

* cited by examiner

*Primary Examiner* — David Payne
*Assistant Examiner* — Omar S Ismail
(74) *Attorney, Agent, or Firm* — Nixon Peabody LLP

(57) ABSTRACT

In conventional optical receivers the dynamic range is obtained by using variable gain amplifiers (VGA) with a fixed trans-impedance amplifier (TIA) gain. To overcome the SNR problems inherent in conventional receivers an improved optical receiver comprises an automatic gain control loop for generating at least one gain control signal for controlling gain of both the VGA and the TIA. Ideally, both the resistance and the gain of the TIA are controlled by a gain control signal.

5 Claims, 11 Drawing Sheets

AUTOMATIC GAIN CONTROL LOOP

TECHNICAL FIELD

The present invention relates to an optical receiver, and in particular to an optical receiver with an analog front-end including an automatic gain control loop.

BACKGROUND

High order modulation schemes, like PAM-m and m-QAM (m>2), are being used in short reach optical communication links in modern data centers for future 400 Gb/s links to achieve higher spectral efficiency with respect to the basic NRZ modulation scheme. Such high order modulation schemes require optical links with strengthened linearity requirement on the transmitter and receiver to not distort the transmitted signal. FIG. 1 illustrates a typical linear optical receiver 1 used in coherent optical receiver comprising a photo diode (PD) 2, a trans-impedance amplifier (TIA) 3, and a variable gain amplifier (VGA) 4, which form the receiver analog front-end (AFE) 5. The optical receiver also comprises an analog to digital converter (ADC) 6 followed by the digital back end 7. The optical signal is received by the PD 2, which generates electric current proportional to the received signal power. The TIA 3 converts the PD current to voltage, which is amplified by the VGA 4 to the desired signal level for the ADC 6. A fixed known signal amplitude is required at the input of the ADC 6 to make correct analog to digital conversion for the following digital back-end 7. The variable gain amplifier 4 is used in the receiver RF chain to control the amplitude of the output signal from the AFE 5 that is fed to the ADC 6. The output signal amplitude from the VGA 4 is set based on the reference voltage of the ADC 6.

Conventionally, linear optical receivers 1 are implemented with an automatic gain control (AGC) loop 8 to fix the receiver AFE output amplitude for the following ADC 6, as shown in FIG. 2. The AGC loop 8 is a negative feedback loop that comprises a peak detector 9 and an error amplifier 11. The amplitude of the voltage signal output from the VGA 4 is sensed using the peak detector 9 and compared with a reference voltage signal (OA) using the error amplifier 11 that drives a gain control signal (GC) of the VGA 4. For large loop DC gain, the AGC loop 8 settles when the output voltage of the peak detector 9 equals the reference voltage signal (OA), which is considered as a controlling knop for the receiver AFE output signal amplitude.

FIG. 3 illustrates a plot of a gain control signal GC for a typical AGC loop 8 versus the input PD current (IPD) at different reference voltage (OA) settings. For the same reference voltage OA signal, the gain control GC signal increases, while the input PD current decreases to maintain the amplitude of the output voltage signal from the VGA 4 constant. The receiver dynamic range is defined as the input PD current range that is affordable by the receiver 1 for a fixed output amplitude as shown in FIG. 3 (between IMIN and IMAX). Moreover, the gain control GC signal value increases with the reference voltage OA signal for the same input PD current. Thus, there are a set of gain control GC values for the same input PD current dynamic range depending on the reference voltage OA signal.

Signals from advanced modulation schemes have high signal to noise ratio (SNR), which must be preserved in the receiver chain until the digital processing, in order to achieve the required bit error rate requirement. Thus, a highly-linear, low-noise optical receiver AFE 5 alongside a high-resolution ADC 6 are required in order not to degrade the received signal SNR. Furthermore, a wide bandwidth receiver AFE 5 is required to avoid any inter symbol interference introduced in the received signal. Consequently, high baud rate coherent optical receivers 1 are characterized using four main aspects: 1) noise, 2) linearity, 3) bandwidth, and 4) dynamic range.

Optical receivers 1 with low noise and high linearity are required in order not to degrade the received signal SNR. For small input PD current levels, the received signal SNR is dominated by the receiver noise; however, for large input PD current levels, the received signal SNR is determined based on the receiver linearity. Typically, the receiver AFE noise is governed by the front-end TIA 3 while its linearity is dominated by the following VGA 4. Thus, a low noise front-end TIA 3 is required to be implemented with a highly linear VGA 4 in the coherent optical receivers 1.

The dynamic range of linear optical receivers is defined as the ratio between the maximum overall trans-impedance gain of the receiver AFE 5 to the minimum trans-impedance gain, which translates to the minimum and maximum photo diode currents that can be amplified by the receiver AFE 5 for fixed output signal amplitude. In coherent optical links, the received optical power can vary between 10 dBm to −15 dBm, which translates to 5 mA to 150 uA photo diode current assuming 0.5 A/W diode responsivity. Conventionally, fixed TIA gain and VGA are utilized in the optical receiver AFE as shown in FIG. 2. However, using one VGA 4 in optical receivers is not sufficient for achieving 25 dB dynamic range, as a single VGA 4 provides, at most, a 15 dB dynamic range.

FIG. 4 illustrates a conventional way to implement an optical receiver AFE 15 with a high dynamic range. Two VGA stages 14a and 14b are utilized for higher receiver dynamic range. The gain from both VGAs 14a and 14b is controlled with the AGC loop 8, such that the gain control signal (GC) of both are driven with same error amplifier 11 (as in FIG. 3). By utilizing two VGA stages 14a and 14b, the achieved receiver overall dynamic range increases as well as its linearity, which improves the received signal SNR for large signal levels. However, this architecture suffers from two main drawbacks: 1) poor noise performance, and 2) bandwidth limitation.

In this architecture, the whole dynamic range of the receiver is obtained by the VGAs 14a and 14b; however, the front-end TIA 3 is implemented with a fixed trans-impedance gain (fixed feedback resistor 12). In order to increase receiver linearity, the value of the TIA feedback resistor 12 is set based on the maximum affordable PD current that can be amplified without degrading the VGAs linearity performance. Therefore, a TIA 3 with a feedback resistor 12 having a small value is utilized in this architecture to improve the receiver linearity in expense of its noise performance, as the TIA noise is inversely proportional to the value of the resistor 12. Large receiver noise degrades the received signal SNR specifically for small input PD current. Consequently, this architecture suffers from noise-linearity tradeoff in determining front-end TIA gain, which limits the received signal SNR either at high input levels or small levels. Furthermore, increasing the number of amplifying stages in the RF chain increases the receiver power consumption as well as it reduces its overall bandwidth.

An object of the present invention is to overcome the shortcomings of the prior art by providing an analog front end with an automatic gain control loop for controlling the gain from both the VGA and the TIA.

SUMMARY OF THE INVENTION

Accordingly, the present invention relates to an optical receiver comprising:

a photodetector for converting an optical signal into an input electrical current signal;

a transimpedance amplifier (TIA) for converting the input electrical current signal into an input voltage signal;

a variable gain amplifier (VGA) for amplifying the input voltage signal to a desired voltage level; and an automatic gain control loop for generating at least one gain control signal for controlling gain of the VGA and the TIA.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
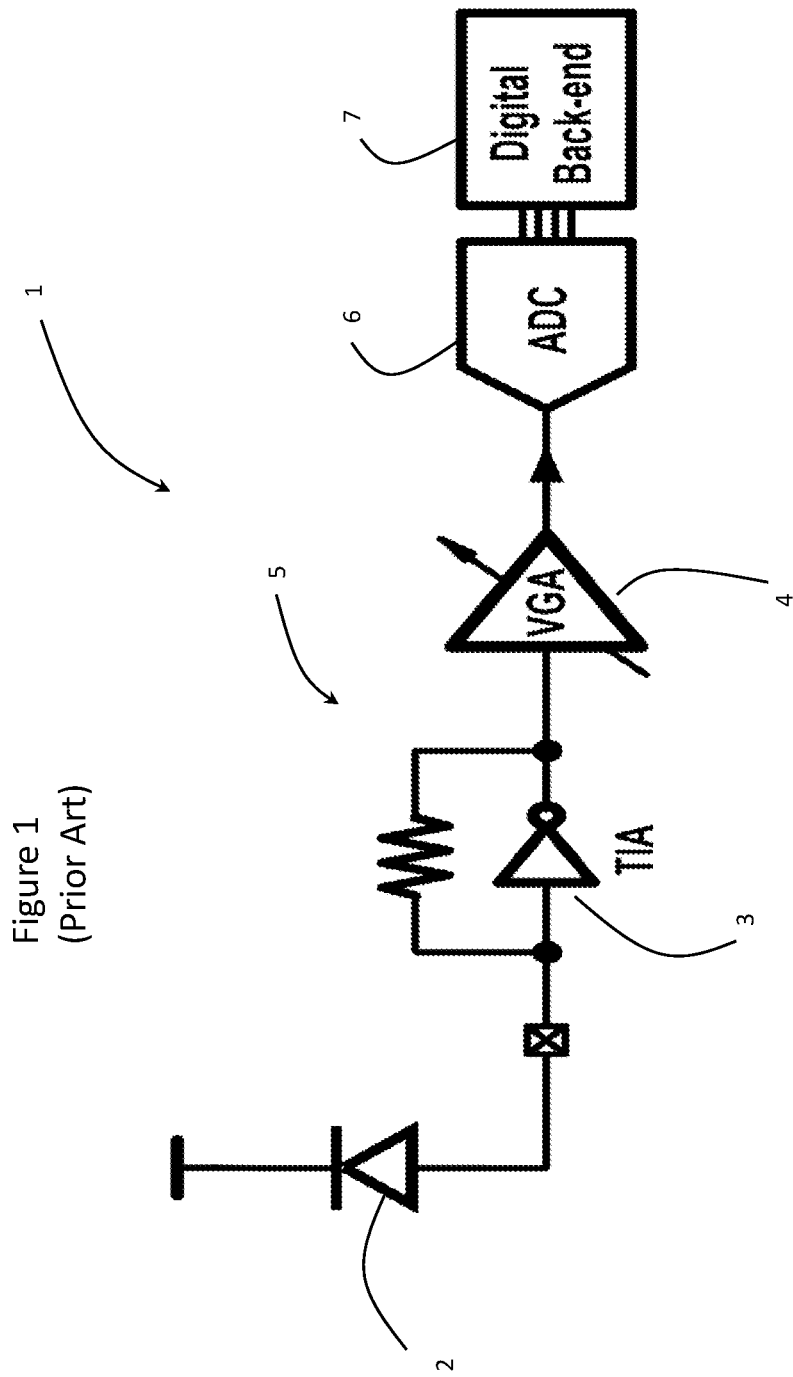
FIG. 1 illustrates a schematic diagram of a conventional optical receiver.
Figure 2:
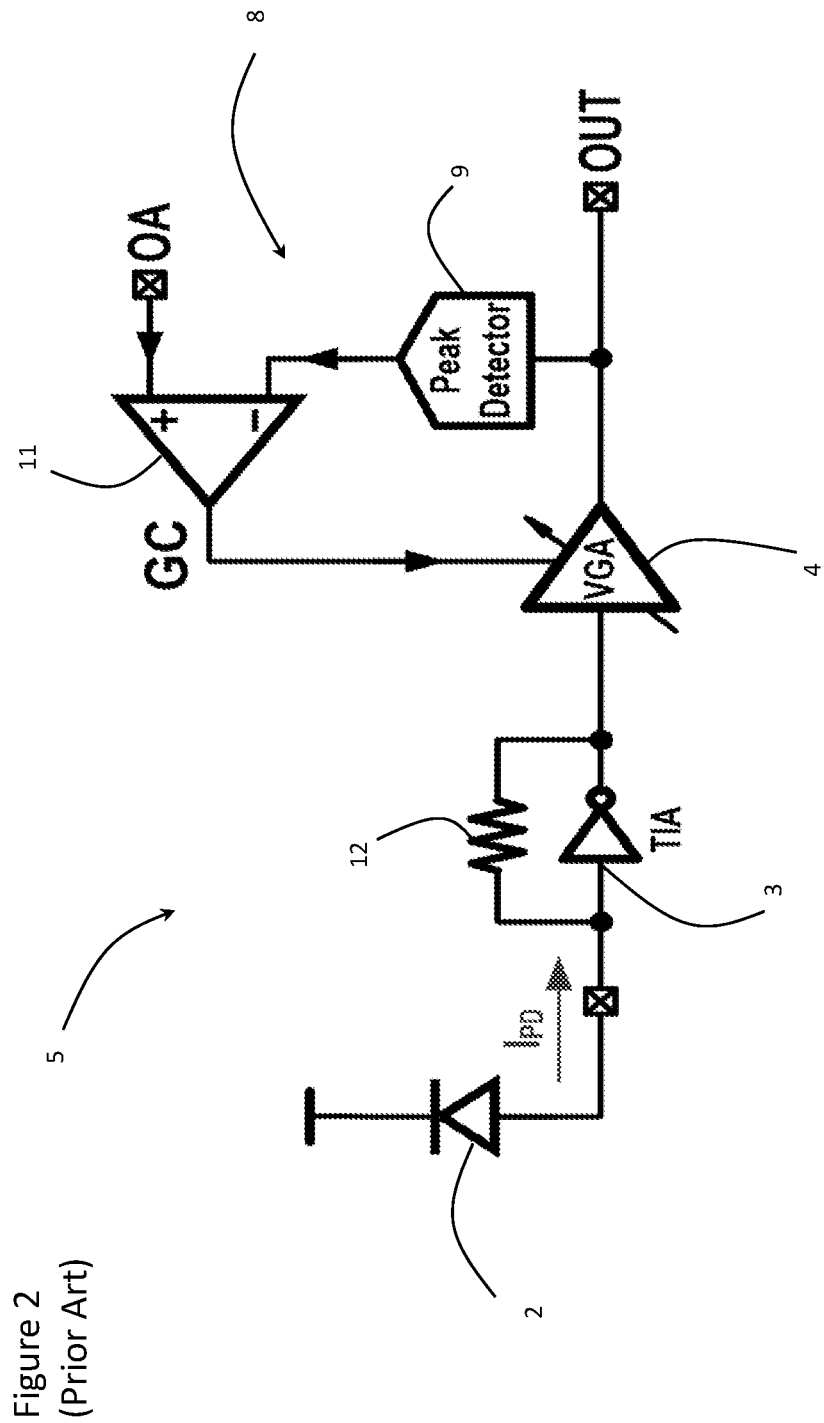
FIG. 2 illustrates a schematic diagram of a conventional optical receiver with an automatic gain control loop.
Figure 3:
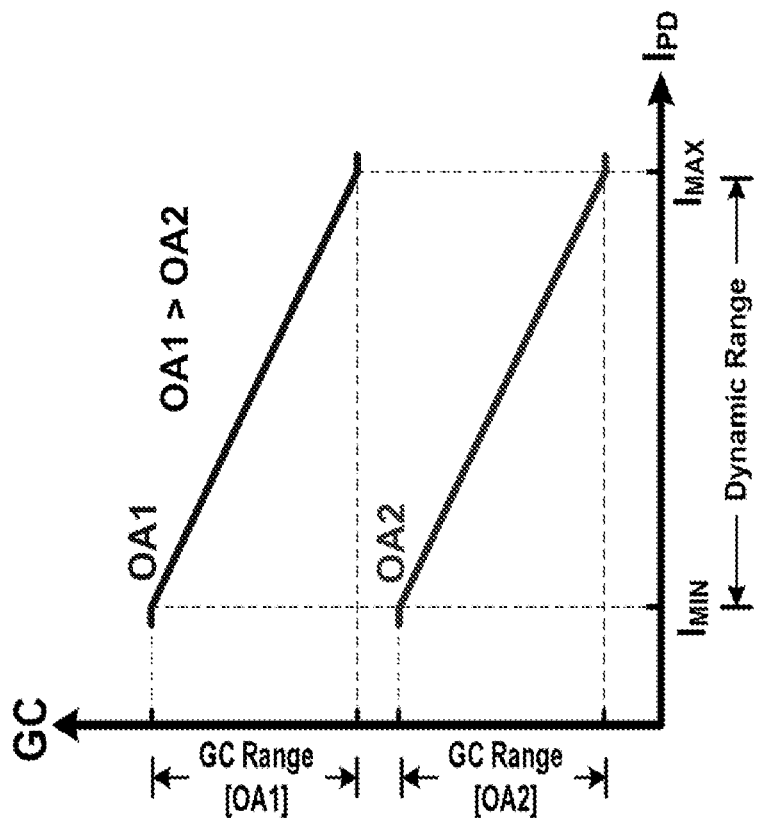
FIG. 3 illustrates a plot of photodetector current vs gain control (GC) value.
Figure 4:
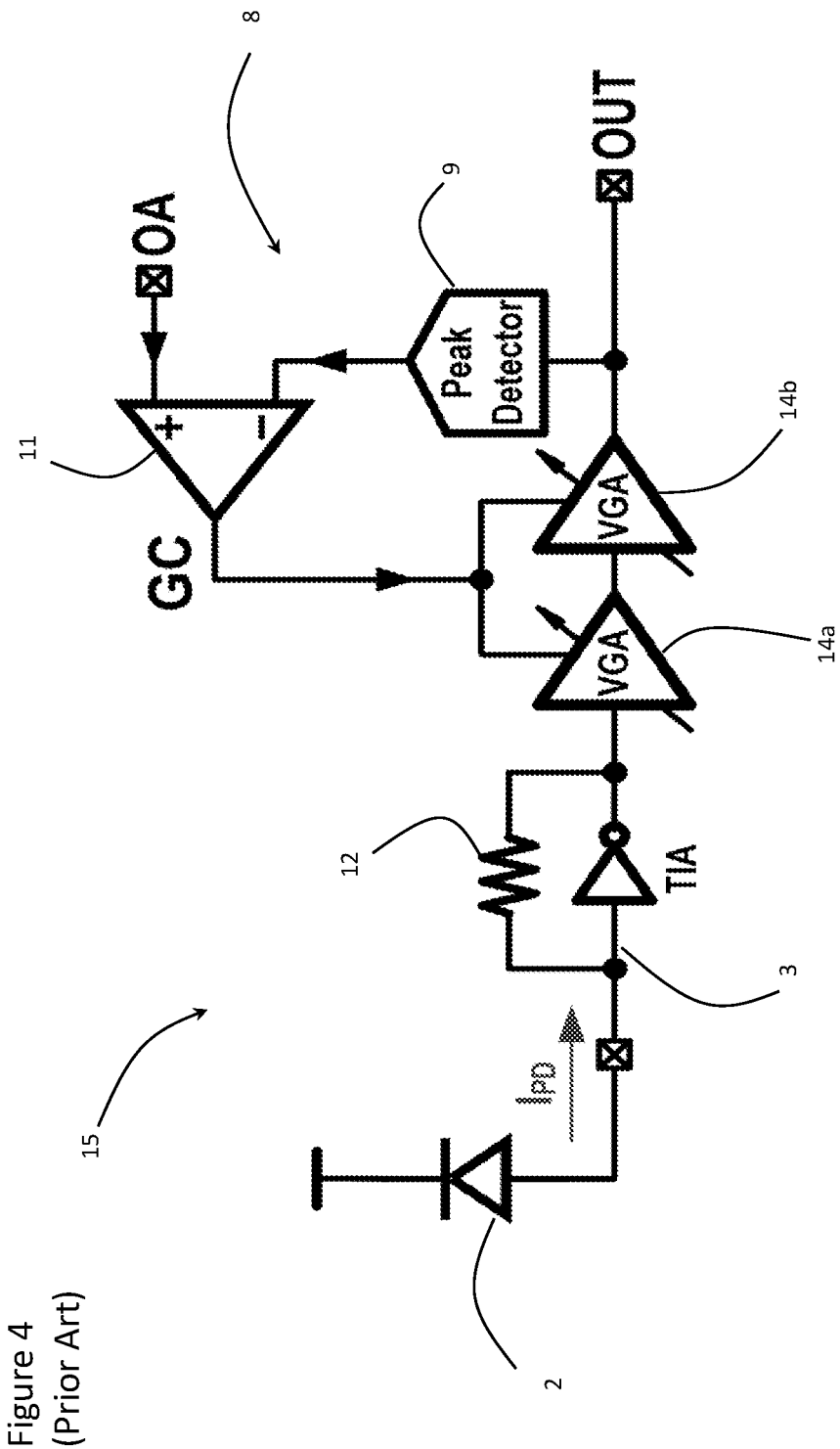
FIG. 4 illustrates a schematic diagram of a conventional optical receiver with a pair of variable gain amplifiers.
Figure 5:
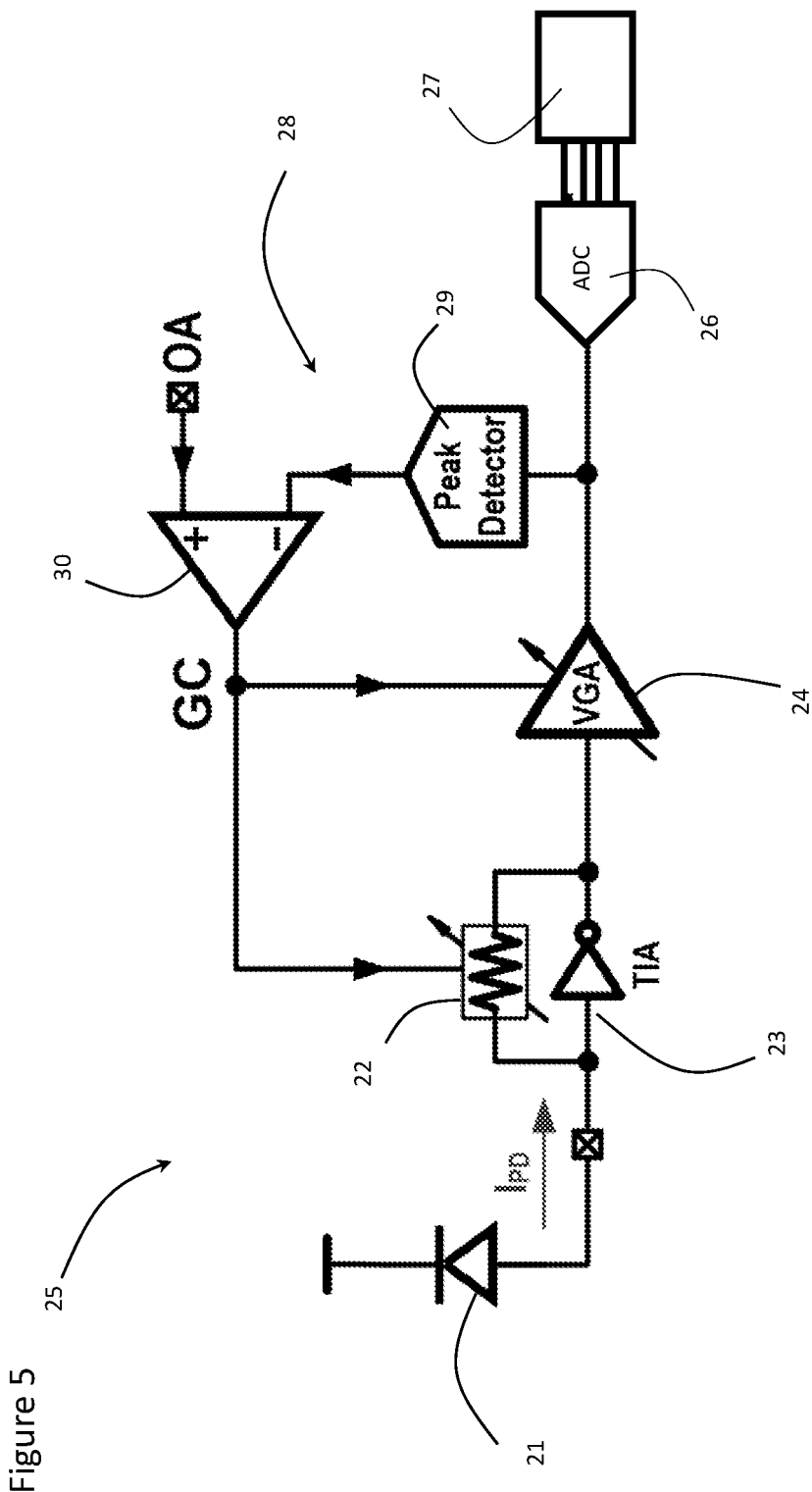
FIG. 5 illustrates a schematic diagram of a optical receiver with a variable gain trans-impedance amplifier in accordance with an embodiment of the present invention.

FIG. 5 illustrates an alternative way to implement a high dynamic range optical receiver AFE 25, including a photodetector 21. A variable gain TIA (VGTIA) 23 with a VGA 24 are utilized to increase the receiver dynamic range. Both the VGTIA 23 and the VGA 24 are controlled with an AGC loop 28 by the same gain control signal (GC). The transimpedance gain of the TIA 23 is controlled by varying the value of a variable feedback resistor 22.

An automatic gain control (AGC) loop 28 may be used to fix the receiver AFE output amplitude for the following ADC 26 and digital back end 27. The AGC loop 28 may be a negative feedback loop that comprises a peak detector 29 and an error amplifier 11. The amplitude of the voltage signal output from the VGA 24 is sensed using the peak detector 29 and compared with a reference voltage signal (OA) using the error amplifier 30 that drives a gain control signal (GC) of the VGA 24. For large loop DC gain, the AGC loop 28 settles when the output voltage of the peak detector 29 equals the reference voltage signal (OA), which is considered as a controlling knop for the receiver AFE output signal amplitude.

Figure 6:
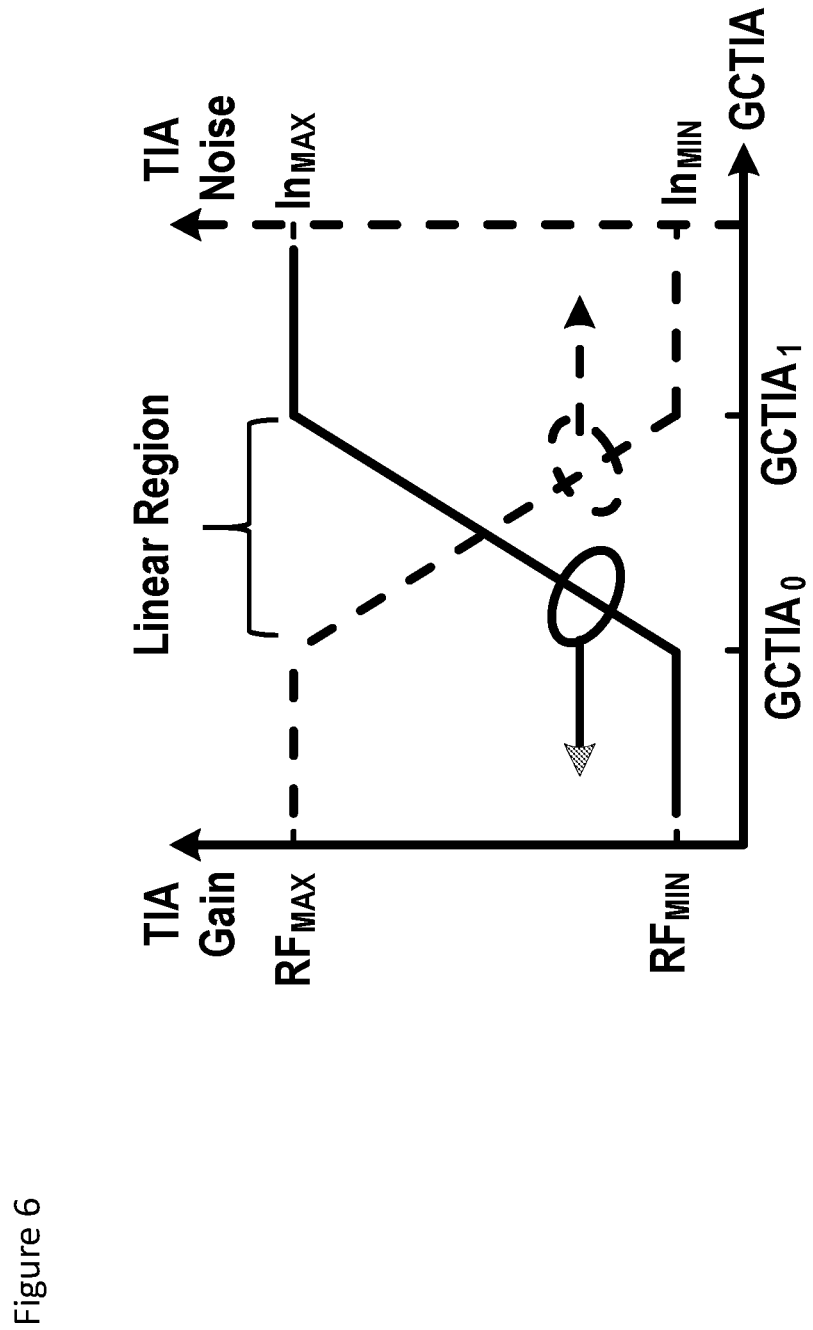
FIG. 6 illustrates a plot of TIA gain control vs TIA gain.

FIG. 6 illustrates a plot of front-end TIA gain and noise versus the gain control signal (GCTIA). The solid line plot shows that the TIA gain has two main states, low gain TIA at low GCTIA values and high gain TIA at high GCTIA values. Low TIA gain is obtained using the variable feedback resistor 22 with a small feedback resistor value at small GCTIA values. TIA noise, shown by the broken line plot, experiences an opposite effect to its gain with GCTIA as the noise increases by decreasing the GCTIA value, i.e. high noise at the low TIA gain and low GCTIA values. However, large TIA gain is obtained using the feedback resistor 22 with a large feedback resistor value at high GCTIA values. Since TIA noise experiences an opposite effect to its gain with GCTIA, the noise is low at the high TIA gain and high GCTIA values. The transition region between the low and high gain TIA states is called TIA gain control linear region, at which the TIA gain changes between the two gain states linearly with GCTIA signal. The TIA gain control linear region is confined between $GCTIA_0$ and $GCTIA_1$ as shown in FIG. 6.

Front-end VGTIA and VGA gains are controlled using the same GC signal of the AGC loop 28 (as in FIG. 5). There are two different ways to coordinate between the variation of TIA gain and VGA gain with GC signal as shown in FIG. 6. In the first way, the TIA gain control linear region is mapped to high values of the GC signal as shown in FIG. 7(a). This way of coordination helps in improving the overall linearity performance as the TIA gain is set to the smallest value for the large input PD currents for any reference voltage OA; however, this configuration suffers from bad TIA noise performance for small reference voltage OA values, because the TIA feedback resistor 22 is set to a minimum value and consequently the TIA noise is high.

Figure 7B:
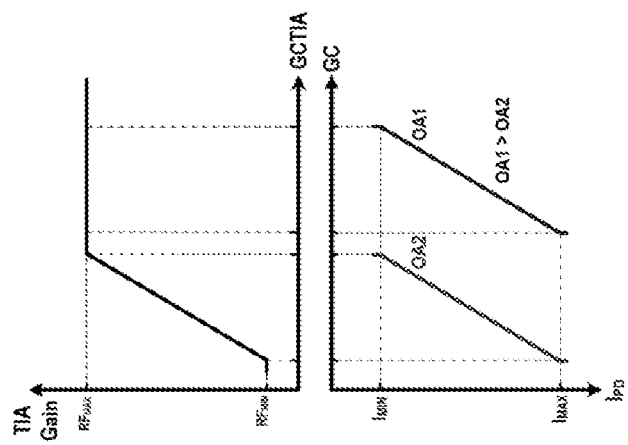
FIGS. 7a and 7b illustrate plots of TIA gain vs TIA gain control, and photodetector current vs gain control for the device of FIG. 5.
Figure 7A:
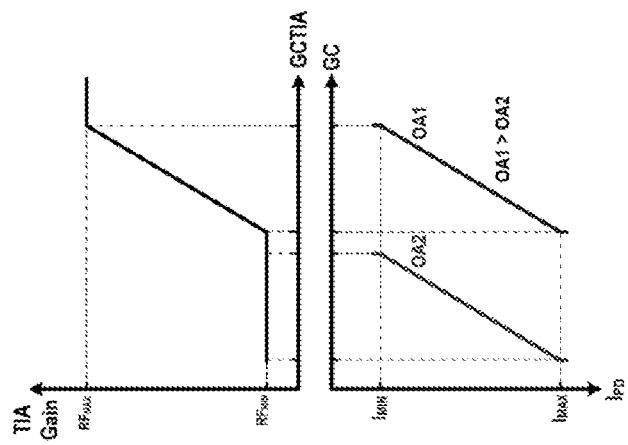

The other configuration to coordinate the gains between both the TIA 23 and the VGA 24 is shown in FIG. 7(b). In this configuration, the TIA gain control linear region is mapped to small values of the GC signal. This way improves the noise performance of the receiver front-end 25 as the largest value of the feedback resistor 22 is utilized for small PD current irrespective to the OA setting. However, this configuration suffers from poor linearity performance for high input PD currents at large OA values.

Figure 8:
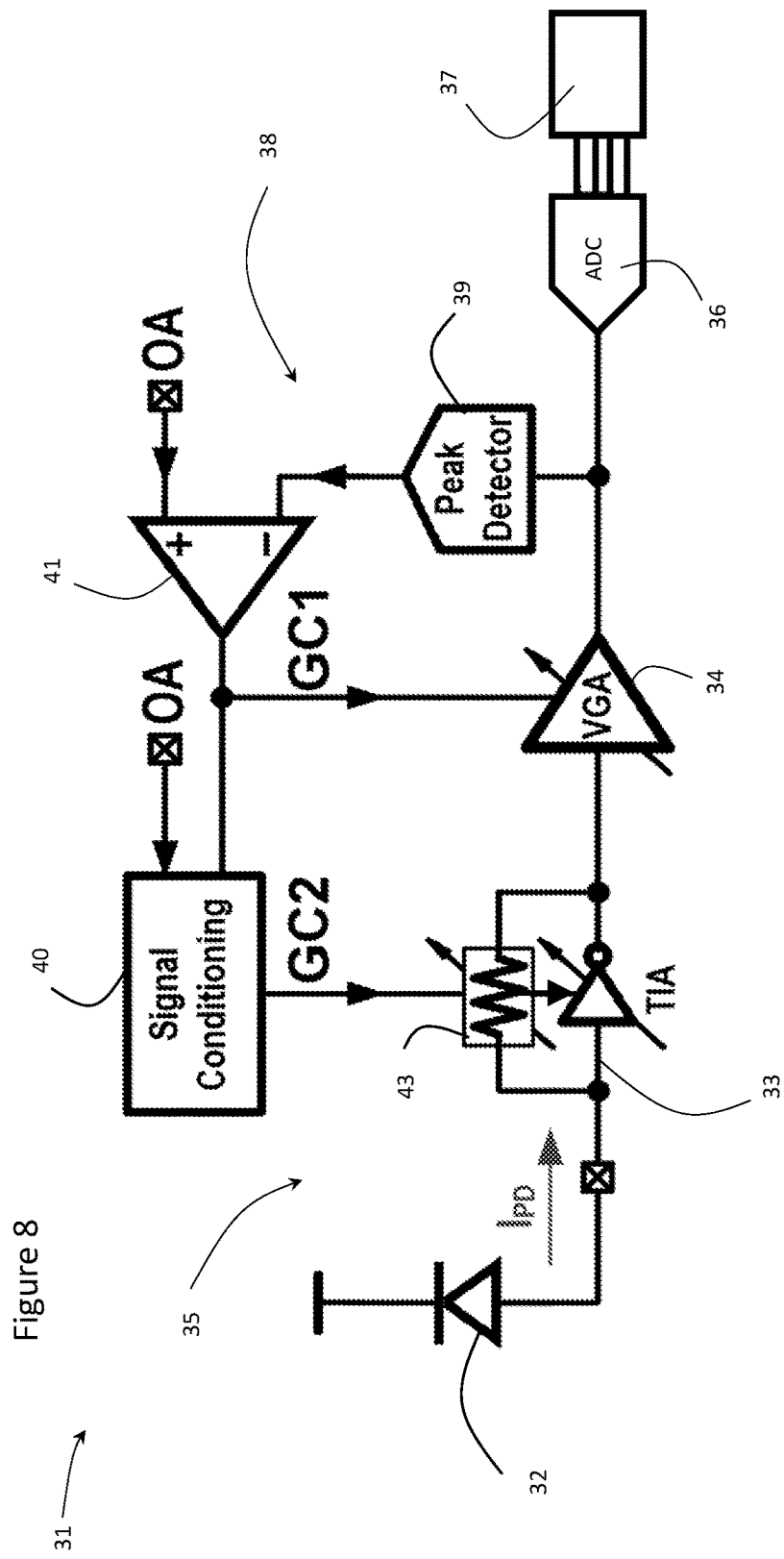
FIG. 8 illustrates a schematic diagram of an optical receiver in accordance with an embodiment of the present invention.

With reference to FIG. 8, an embodiment of the present invention comprises a linear optical receiver 31 including an AFE 35 with high dynamic range. The optical receiver 31, which may be used in a coherent optical receiver, comprises a photo diode (PD) 32, a trans-impedance amplifier (TIA) 33, and a variable gain amplifier (VGA) 34, which form the receiver analog front-end (AFE) 35. The optical receiver 31 also comprises an analog to digital converter (ADC) 36 followed by the digital back end 37. The optical signal is received by the PD 32, which generates electric current proportional to the received signal power. The TIA 33 converts the PD current signal to an input voltage signal, which is amplified by the VGA 34 to the desired signal level for the ADC 36. A fixed known signal amplitude is required at the input of the ADC 36 to make correct analog to digital conversion for the following digital back-end 37. The VGA 34 is used in the receiver RF chain to control the amplitude of the output voltage signal from the AFE 35 that is fed to the ADC 36. The output signal amplitude from the VGA 34 is set based on a reference voltage OA, which is based on known signal amplitudes required by the ADC 36.

An automatic gain control (AGC) loop 38 is provided to fix the output amplitude of the receiver AFE 35 for the following ADC 36. The AGC loop 38 is a negative feedback loop that comprises a peak detector 39 and an error amplifier 41. The amplitude of the voltage signal output from the VGA 34 is sensed using the peak detector 39 and compared with the reference voltage signal (OA) using the error amplifier 41, which drives a gain control signal (GC1) to the VGA 34. For large loop DC gain, the AGC loop 38 settles when the output voltage of the peak detector 39 equals the reference voltage signal (OA).

Figure 11:
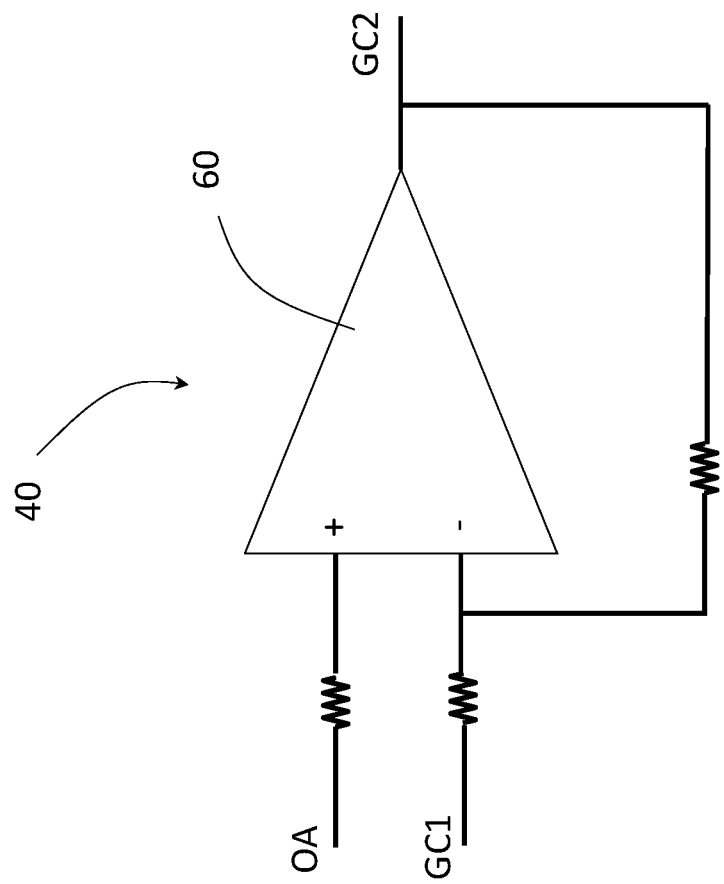
FIG. 11 illustrates a signal conditioning circuit in accordance with the optical receiver of FIG. 8.

The variable gain TIA (VGTIA) 33 and the VGA 34 are utilized to increase the dynamic range of the optical receiver 30. In the proposed architecture, two different gain control signals, e.g. a first gain control signal GC1 and a second gain control signal GC2, may be utilized for the VGA 34 and the VGTIA 33, respectively. The first gain control signal GC1 is generated using the error amplifier 41 of the AGC loop 38. A signal conditioning circuit 40 is utilized to generate the second gain control signal GC2 for the TIA 33 using the first gain control signal GC1 and the reference voltage OA signal, as illustrated in FIG. 11. The signal conditioning circuit 40 may adjust the starting point and the slope of the voltage control line for GC1 and GC2, and may include an opamp 60 receiving the OA and GC1 signals and outputting the GC2 signal. The same reference voltage OA signal may be used for both the TIA 33 and the VGA 34 or different reference voltages may be used.

The transimpedance gain from the TIA 33 may be controlled by varying a value of a variable feedback resistor 43 and the feed-forward amplifier gain simultaneously. The proposed architecture improves the receiver noise and linearity over wide range of input PD current levels at different reference voltage OA settings. Controlling gain from the VGTIA 33 and the VGA 34 with two different control signals, GC1 and GC2, resolves the trade-off between noise and linearity shown in the prior art. The AFE 35 results in a high SNR of the received signal irrespective to its strength, such that the AFE 35 has the best noise performance for small input currents from the photodetector (PD) 32; while having the best linearity performance for large PD currents.

Figure 9:
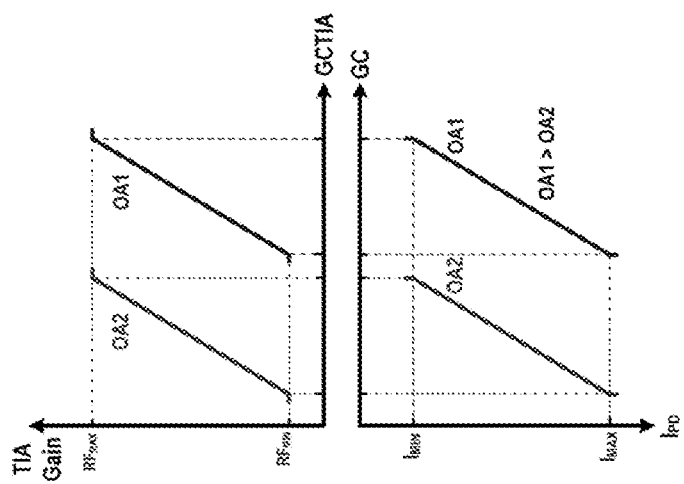
FIG. 9 illustrates a plot of TIA gain vs TIA gain control, and photodetector current vs gain control for the device of FIG. 8.

As illustrated in FIG. 9, in the proposed embodiment, the gain from the front-end TIA 33 depends on the second gain control signal GC2 as well as the reference voltage OA signal. A set of TIA gain controls curves are generated by shifting the TIA gain control linear region based on the reference voltage OA signal. Using this technique, the TIA gain variation is consistent with the input PD current variation, such that the TIA variable feedback resistor 43 has the largest value for small input PD current and smallest value for large input PD current, which improves the receiver noise and linearity performances. Accordingly, the receiver AFE 35 improves the received signal SNR irrespective to input PD current level or the OA signal value. Furthermore, utilizing the VGTIA 33 and only the one VGA 34, instead of a fixed gain TIA followed by two VGAs offers wider bandwidth performance with lower power consumption.

On the other hand, the proposed receiver AFE 35 may use a shunt feedback TIA topology to implement the VGTIA 33. Shunt feedback TIA loop stability depends on the feed-forward gain Ao with the value $R_F$ of the feedback resistor 43. Accordingly, the phase margin of the VGTIA is expressed as, $$\phi_m \approx \tan^{-1} \frac{\sqrt{C_T^2 \omega_o^2 + \sqrt{C_T^4 \omega_o^4 + C_T^2 \omega_o^2 \frac{4A_0^2}{R_F^2}}}}{\frac{2A}{R_F}} \quad \text{Equation 1}$$

where $C_T$ is the input node capacitance of the TIA 33 and $\omega_o$ is the feed-forward amplifier bandwidth of the TIA 33. The above equation depicts that the TIA phase margin degrades significantly by reducing the feedback resistor 43 for constant feed-forward amplifier gain. Thus, implementing the variable gain TIA (VGTIA) 33 with a fixed feed-forward gain $A_o$ has stability issues for small feedback resistor values which limits its dynamic range. The proposed receiver AFE 35 may use a variable gain feed-forward amplifier in the front-end VGTIA 33 to improve its stability by maintaining its phase margin constant by varying the value of the feedback resistor $R_F$ and the feed forward gain $A_o$ simultaneously, ideally with the same ratio (in Eq. 1) and preferably keeping $R_F/A_o$ constant.

Figure 10:
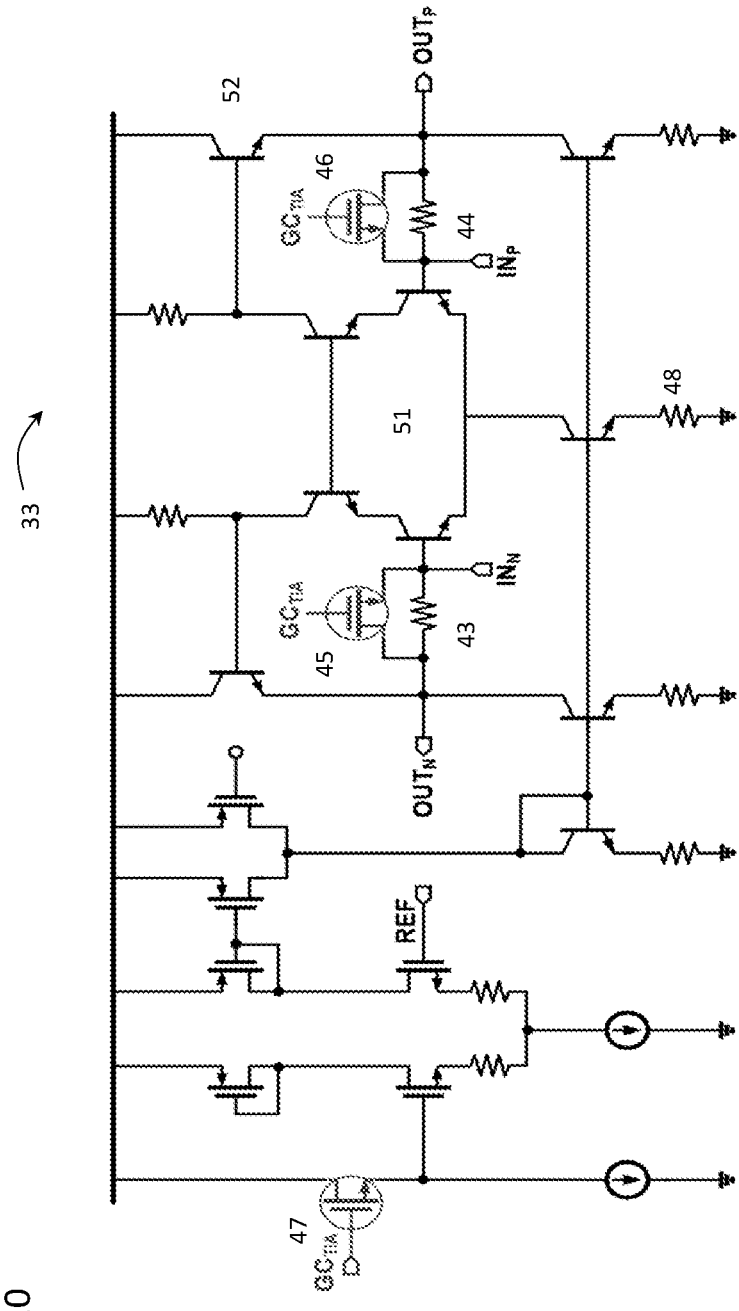
FIG. 10 illustrates a schematic diagram of a trans-impedance amplifier in accordance with an embodiment of the present invention.

An example of the TIA 33 of the proposed embodiment is shown in FIG. 10. The TIA 33 comprises a differential TIA with a feed-forward amplifier of CML stage 51 followed by an emitter follower 52. The feed-forward amplifier gain $A_o$ is controlled by varying the DC current of the CIVIL stage 51. The gain variation of the feed-forward amplifier is consistent with the variation of the effective value of the feedback resistors 43 and 44. The effective value of the feedback resistance $R_F$ is controlled by the gain control signal $GC_2$ or $GC_{TIA}$ applied to the gates of control transistors 45 and 46, connected in parallel with the fixed feedback resistors 43 and 44, respectively. At the same time, the gain $A_0$ of the core amplifier is controlled by a tail current 48. The tail current 48 is set by the tail current transistor 47, which is also controlled by the gain control signal $GC_2$ or $GC_{TIA}$.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An optical receiver comprising:
    a photodetector for converting an optical signal into an input electrical current signal;
    a transimpedance amplifier (TIA) for converting the input electrical current signal into an input voltage signal, the TIA including a variable feedback resistor and a variable gain feed-forward amplifier;
    a variable gain amplifier (VGA) for amplifying the input voltage signal to a desired voltage level; and
    an automatic gain control loop for generating a first gain control signal for controlling gain of the VGA, and a second gain control signal for controlling the gain of the TIA;
       wherein the automatic gain control loop further comprises a signal conditioning circuit for generating the second gain control signal for controlling gain of the TIA based on the first gain control signal;

wherein the second gain control signal is capable of adjusting a value of the variable feedback resistor, whereby the TIA gain varies linearly with a level of the second gain control signal; and wherein the second gain control signal is also capable of varying a feed forward gain $A_o$ of the TIA.

2. The optical receiver according to claim 1, wherein the at least one gain control signal is based on a reference voltage, which is based on the desired voltage level.

3. The optical receiver according to claim 1, wherein the automatic gain control loop is capable of generating the first gain control signal, whereby the VGA gain varies linearly with a level of the first gain control signal.

4. The optical receiver according to claim 1, wherein the second gain control signal is capable of varying the value of the feedback resistor $R_F$ and the feed forward gain $A_o$ simultaneously with substantially a same ratio.

5. The optical receiver according to claim 1, further comprising an analog to digital converter (ADC) for converting the amplified input voltage signal into a digital signal.

* * * * *